United States Patent
Meyer et al.

(10) Patent No.: US 8,039,395 B2
(45) Date of Patent: Oct. 18, 2011

(54) TECHNIQUE FOR FORMING EMBEDDED METAL LINES HAVING INCREASED RESISTANCE AGAINST STRESS-INDUCED MATERIAL TRANSPORT

(75) Inventors: Moritz-Andreas Meyer, Dresden (DE); Hans-Juergen Engelmann, Dresden (DE); Ehrenfried Zschech, Moritzburg (DE); Peter Huebler, Coswig (DE)

(73) Assignee: Globalfoundries Inc., Grand Cayman (KY)

( * ) Notice: Subject to any disclaimer, the term of this patent is extended or adjusted under 35 U.S.C. 154(b) by 1586 days.

(21) Appl. No.: 11/009,575

(22) Filed: Dec. 10, 2004

(65) Prior Publication Data
US 2005/0161817 A1    Jul. 28, 2005

(30) Foreign Application Priority Data
Jan. 26, 2004    (DE) .......................... 10 2004 003 863

(51) Int. Cl.
*H01L 21/4763* (2006.01)
(52) U.S. Cl. .. 438/687; 438/643; 438/659; 257/E21.495
(58) Field of Classification Search ................. 438/687, 438/627, 637, 659
See application file for complete search history.

(56) References Cited

U.S. PATENT DOCUMENTS

| | | | |
|---|---|---|---|
| 6,130,161 A | 10/2000 | Ashley et al. | 438/687 |
| 6,309,959 B1 | 10/2001 | Wang et al. | 438/625 |
| 6,461,675 B2 | 10/2002 | Paranjpe et al. | 427/250 |
| 6,650,957 B1 | 11/2003 | Campbell et al. | 700/121 |
| 2004/0188850 A1* | 9/2004 | Lee et al. | 257/774 |
| 2004/0259378 A1* | 12/2004 | Chambers et al. | 438/771 |

FOREIGN PATENT DOCUMENTS
WO    WO 03/046978    6/2003

* cited by examiner

*Primary Examiner* — Thanh Nguyen
(74) *Attorney, Agent, or Firm* — Williams, Morgan & Amerson, P.C.

(57) ABSTRACT

An alloy forming dopant material is deposited prior to the formation of a copper line, for instance by incorporating the dopant material into the barrier layer, which is then driven into the vicinity of a weak interface by means of a heat treatment. As indicated by corresponding investigations, the dopant material is substantially transported to the weak interface through grain boundary regions rather than through the bulk copper material (copper grains), thereby enabling moderately high alloy concentrations in the vicinity of the interface while maintaining a relatively low overall concentration within the grains. The alloy at the interface reduces electromigration along the interface.

27 Claims, 3 Drawing Sheets

TECHNIQUE FOR FORMING EMBEDDED METAL LINES HAVING INCREASED RESISTANCE AGAINST STRESS-INDUCED MATERIAL TRANSPORT

BACKGROUND OF THE INVENTION

1. Field of the Invention

Generally, the present invention relates to the formation of microstructures, such as advanced integrated circuits, and, more particularly, to the formation of conductive structures, such as copper-based interconnect lines, and techniques to reduce their degradation during stress conditions.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines also have to be reduced to compensate for a reduced amount of available floor space and an increased number of circuit elements provided per unit die area, as typically the number of interconnections required increases more rapidly than the number of circuit elements. Thus, a plurality of stacked "wiring" layers, also referred to as metallization layers, are usually provided, wherein individual metal lines of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance, modern CPUs, memory chips, ASICs (application specific ICs) and the like. The reduced cross-sectional area of the interconnect structures, possibly in combination with an increase of the static power consumption of extremely scaled transistor elements, may result in considerable current densities in the metal lines.

Advanced integrated circuits, including transistor elements having a critical dimension of 0.13 µm and even less, may, therefore, require significantly increased current densities of up to several kA per $cm^2$ in the individual interconnect structures, despite the provision of a relatively large number of metallization layers, owing to the significant number of circuit elements per unit area. Operating the interconnect structures at elevated current densities, however, may entail a plurality of problems related to stress-induced line degradation, which may finally lead to a premature failure of the integrated circuit. One prominent phenomenon in this respect is the current-induced material transportation in metal lines and vias, also referred to as "electromigration," which may lead to the formation of voids within and hillocks next to the metal interconnect, thereby resulting in reduced performance and reliability or complete failure of the device. For instance, aluminum lines embedded into silicon dioxide and/or silicon nitride are frequently used as metal for metallization layers, wherein, as explained above, advanced integrated circuits having critical dimensions of 0.18 µm or less, may require significantly reduced cross-sectional areas of the metal lines and, thus, increased current densities, which may render aluminum less attractive for the formation of metallization layers.

Consequently, aluminum is being replaced by copper, a material with significantly lower resistivity and improved resistance to electromigration even at considerably higher current densities compared to aluminum. The introduction of copper into the fabrication of microstructures and integrated circuits comes with a plurality of severe problems residing in copper's characteristic to readily diffuse in silicon dioxide and a plurality of low-k dielectric materials. To provide the necessary adhesion and to avoid the undesired diffusion of copper atoms into sensitive device regions, it is, therefore, usually necessary to provide a barrier layer between the copper and the dielectric material in which the copper-based interconnect structures are embedded. Although silicon nitride is a dielectric material that effectively prevents the diffusion of copper atoms, selecting silicon nitride as an interlayer dielectric material is less then desirable, since silicon nitride exhibits a moderately high permittivity, thereby increasing the parasitic capacitances of neighboring copper lines, which may result in non-tolerable signal propagation delays. Hence, a thin conductive barrier layer that also imparts the required mechanical stability to the copper is formed to separate the bulk copper from the surrounding dielectric material and only a thin silicon nitride or silicon carbide or silicon carbon nitride layer in the form of a capping layer is frequently used in copper-based metallization layers. Currently, tantalum, titanium, tungsten and their compounds with nitrogen and silicon and the like are preferred candidates for a conductive barrier layer, wherein the barrier layer may comprise two or more sub-layers of different composition to meet the requirements in terms of diffusion suppressing and adhesion properties.

Another characteristic of copper significantly distinguishing it from aluminum is the fact that copper may not be readily deposited in larger amounts by chemical and physical vapor deposition techniques, in addition to the fact that copper may not be efficiently patterned by anisotropic dry etch processes, thereby requiring a process strategy that is commonly referred to as the damascene or inlaid technique. In the damascene process, a dielectric layer is formed which is then patterned to include trenches and vias which are subsequently filled with copper, wherein, as previously noted, prior to filling in the copper, a conductive barrier layer is formed on sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.3 µm or even less, in combination with trenches having a width ranging from 0.1 µm to several µm.

Electrochemical deposition processes for copper are well established in the field of electronic circuit board fabrication. However, the void-free filling of high aspect ratio vias is an extremely complex and challenging task, wherein the characteristics of the finally obtained copper-based interconnect structure significantly depend on process parameters, materials and geometry of the structure of interest. Since the geometry of interconnect structures is determined by the design requirements and may, therefore, not be significantly altered for a given microstructure, it is of great importance to estimate and control the impact of materials, such as conductive and non-conductive barrier layers, of the copper microstructure and their mutual interaction on the characteristics of the interconnect structure to insure both high yield and the required product reliability. In particular, it is important to identify, monitor and reduce degradation and failure mechanisms in interconnect structures for various configurations to maintain device reliability for every new device generation or technology node.

Accordingly, a great deal of effort has been invested in investigating the degradation of copper interconnects, especially in view of electromigration, in order to find new materials and process strategies for forming metal lines and vias. Although the exact mechanism of electromigration in copper lines is still not quite fully understood, it turns out that voids positioned in and on sidewalls and especially at interfaces to neighboring materials may have a significant impact on the finally achieved performance and reliability of the interconnects.

One failure mechanism, which is believed to significantly contribute to a premature device failure, is the electromigration-induced material transport, particularly along an interface formed between the copper and a dielectric capping layer acting as an etch stop layer during the formation of vias in the interlayer dielectric. Frequently used materials are, for example, silicon nitride and silicon carbon nitride, which exhibit a moderately high etch selectivity to typically employed interlayer dielectrics, such as silicon dioxide and a plurality of low-k dielectric materials, and also suppress the diffusion of copper onto the interlayer dielectric. Recent research results seem to indicate, however, that the interface formed between the copper and the etch stop layer is a major diffusion path for material transport during operation of the metal interconnect.

For state-of-the-art copper interconnect structures, the number and the strength of the bondings between the copper and the material of the etch stop layer is less compared to the strength and number of bondings formed between the copper and the conductive barrier layer, which covers the sidewalls and the bottom face of the metal interconnect. Consequently, the activation energy required for causing a stress-induced material transport, for instance in the form of electromigration, seems to be lowest at the interface between the etch stop layer and the copper for state-of-the-art copper interconnect structures, thereby rendering this interface the main cause for premature interconnect failure and reduced reliability. Therefore, great efforts have been made in developing new techniques that enable strengthening of this interface to increase the resistance against electromigration. For instance, in WO 02/050882, a method is described to form a copper alloy by depositing a dopant layer above a copper line and driving the dopants into the line. In alternative methods, a dopant is introduced into the copper line by ion implantation or the dopant material is introduced into the copper seed layer and is driven into the copper after the deposition of the bulk copper. While the first two techniques enable the formation of a copper alloy in the vicinity of the interface to the etch stop layer, which may reduce electromigration effects, the latter alternative may produce a significant amount of copper alloy throughout the entire copper line. However, while the former alternatives require additional process steps, thereby rendering the proposed technique cost intensive and possibly less reliable, the latter alternative may contribute to an increased electrical resistance of the copper line due to the presence of a moderate amount of copper alloy, which has a significantly higher electrical resistivity compared to pure copper.

In view of the above-described problems, there exists a need for a technique that allows the reduction of electromigration in copper interconnect structures without unduly increasing production costs and affecting the electrical conductivity of the metal interconnect.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the location of a dopant material which forms an alloy with copper at a weak interface, i.e., an interface requiring reduced activation energy for stress-induced material transport, to thereby strengthen this interface against stress-induced material transport, such as electromigration. The alloying element may be deposited prior to the deposition of any copper and may be driven to the interface by a thermally-induced diffusion process.

According to one illustrative embodiment of the present invention, a method comprises forming a conductive barrier layer over an exposed surface of a dielectric layer that is formed on a substrate, wherein the barrier layer includes a dopant material. A copper-containing layer is then formed above the barrier layer and a dielectric capping layer is formed above the copper-containing layer. Finally, a first heat treatment is performed on the substrate to drive a portion of the dopant material towards the capping layer.

According to another illustrative embodiment of the present invention, a method of forming a copper-containing interconnect line comprises forming a trench in a dielectric layer formed on a substrate. Moreover, a dopant layer is formed on exposed surfaces of the trench prior to the deposition of a copper-containing metal, wherein the dopant layer comprises a dopant material that is able to reduce a stress-induced material transport in a copper-containing metal. An interconnect line is then formed in the trench by depositing a copper-containing metal and the substrate is heat treated to drive a portion of the dopant material into grain boundaries of the copper-containing metal.

In accordance with yet another illustrative embodiment of the present invention, a method comprises forming a copper alloy by driving a dopant material from a barrier layer into an adjacent copper layer according to a plurality of different process conditions. Then, a value of at least one characteristic of the copper layer is determined for each of the different process conditions. Moreover, a process condition is selected corresponding to a desired value of the at least one characteristic, and finally a copper-based interconnect line is formed on one or more product substrates using the selected process condition.

According to still another illustrative embodiment of the present invention, a semiconductor device comprises a copper-based interconnect line formed in a dielectric layer, wherein sidewall surfaces and bottom surface portions of the metal line are covered by a barrier layer and wherein a top surface portion of the metal line is covered by a dielectric capping layer to form an interface therebetween. The semiconductor device further comprises a copper alloy including a specified dopant material, which is formed at the interface. In one embodiment, the barrier layer comprises the dopant material in a concentration that is equal to or higher than a concentration of the dopant material at the interface.

According to yet a further illustrative embodiment of the present invention, a semiconductor device comprises a copper-based interconnect line formed in a dielectric layer, wherein the interconnect line comprises a plurality of grains separated by grain boundary regions. Moreover, the semiconductor device comprises a copper alloy formed in the interconnect line, wherein an average concentration of the copper alloy within the grains is less than an average concentration of the copper alloy within the grain boundary regions.

BRIEF DESCRIPTION OF THE DRAWINGS

The invention may be understood by reference to the following description taken in conjunction with the accompanying drawings, in which like reference numerals identify like elements, and in which.

Figure 1A:
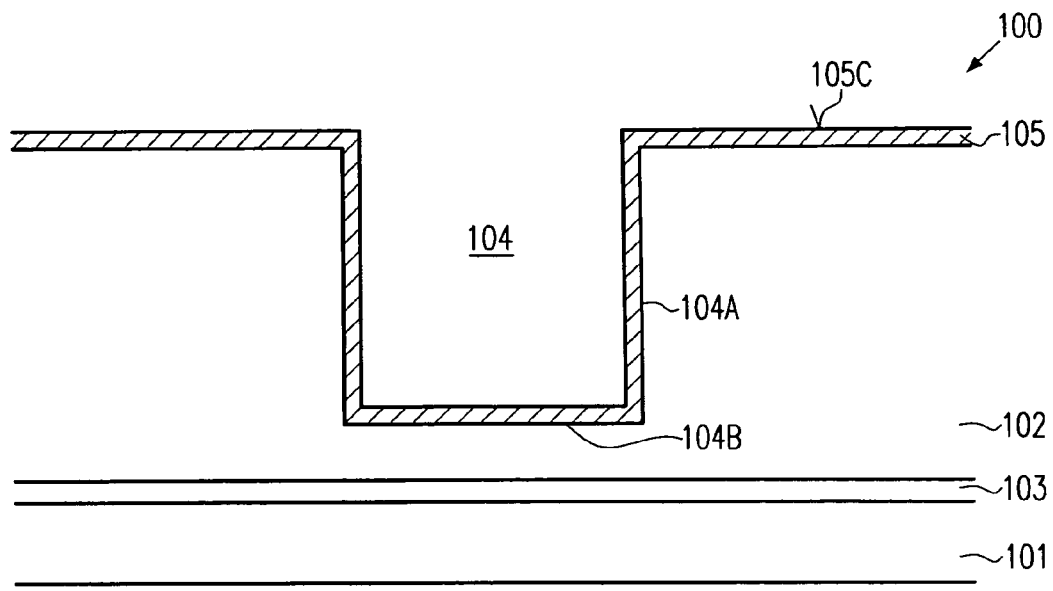
FIGS. 1a-1f schematically show cross-sectional views of a semiconductor device including a copper-based interconnect line with a copper alloy formed at an interface during various manufacturing steps in accordance with illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the concept that a dopant material, for instance aluminum, forming an alloy with copper may be provided prior to the deposition of the copper and may then be supplied towards a weak interface by a diffusion process, wherein advantageously a highly non-conformal distribution of the alloying element within the copper occurs. Without intending to restrict the present invention to the following explanation, it is believed that the diffusion process of an alloying element substantially takes place within grain boundary regions, while the concentration of the alloy within the copper grains is significantly less. As a consequence, by initiating a diffusion process at a temperature that is sufficient to cause an enhanced mobility of the alloying element, the overall concentration of the dopant material within the bulk copper alloy is maintained at a relatively low level, wherein an efficient diffusion path to any weak interfaces is provided by the grain boundaries. Thus, a copper/dopant alloy is preferably formed at the weak interface, thereby significantly modifying the electromigration and other stress-induced material transport effects. With reference to the accompanying drawings, the basic concept will now be described by means of further illustrative embodiments in more detail.

FIG. 1a schematically shows a cross-sectional view of a semiconductor device 100 during a moderately advanced manufacturing stage. The semiconductor device 100 comprises a substrate 101, which may represent any substrate that is appropriate for forming semiconductor devices thereon. For instance, the substrate 101 may be a semiconductor substrate, an insulating substrate having formed thereon a crystalline semiconductor region, such as a crystalline silicon region, and the like. Typically, the substrate 101 may represent a carrier having formed thereon a large number of circuit elements, such as transistors, capacitors, resistors and the like, as are required for integrated circuits. These circuit elements may be electrically connected in accordance with the circuit design by means of one or more metallization layers, wherein, for convenience, the formation of a single metallization layer including a single metal line is described herein. It may, however, be readily appreciated that the concept of forming a copper alloy in an interconnect line or via, and taking advantage of the enhanced diffusivity of alloying elements within copper grain boundary regions, may readily be applied to any complex device configuration including a plurality of metallization layers and a large number of interconnect lines and vias. Moreover, although the present invention is particularly advantageous for extremely scaled semiconductor devices since here, as previously discussed, moderately high current densities are usually encountered during the operation of the device, the present invention is also readily applicable and advantageous for moderately scaled devices due to a significantly enhanced reliability and lifetime that is obtainable by further reducing electromigration and other stress-induced material transport phenomena.

The semiconductor device 100 may further comprise a first etch stop layer 103, for instance formed of silicon nitride, silicon carbon nitride, and the like, which may be used in forming vias (not shown) to an underlying circuit element or to an underlying metallization layer (not shown). A dielectric layer 102, also referred to as interlayer dielectric, is formed above the etch stop layer 103 and may be comprised of any appropriate material, such as silicon dioxide or dielectric materials having a low dielectric constant, as is typically required in sophisticated semiconductor devices to reduce the parasitic capacitance between neighboring metal lines. A trench 104 is formed in the dielectric layer 102 and has dimensions, i.e., a width (the horizontal direction in FIG. 1a), a depth (the vertical direction), and a length (the dimension perpendicular to the drawing plane of FIG. 1a) in accordance with design requirements. A bottom surface 104b, or at least portions thereof, and sidewall surfaces 104a of the trench 104 are covered by a conductive barrier layer 105, which comprises a material that significantly suppresses a diffusion of copper atoms into the dielectric layer 102. The barrier layer 105 may, for instance, comprise tantalum, tantalum nitride, titanium, titanium nitride, tungsten, tungsten nitride, silicon, cobalt, and combinations thereof. In one particular embodiment, the barrier layer 105 additionally comprises a dopant material forming an alloy when combined with copper. For instance, the dopant material may be comprised of tin, magnesium, cobalt and the like. In one particular embodiment, the barrier layer 105 comprises aluminum as the dopant material. The dopant material may be incorporated in the barrier layer 105 or specified portions thereof in an amount of approximately 1-100 atomic %, while in other embodiments the percentage may range from approximately 1-30 atomic %. It should be noted that the above-specified ranges for the dopant concentration relate to the upper surface 105c of the barrier layer 105 and the concentration of the dopant material may vary throughout the thickness of the barrier layer 105, wherein advantageously the peak concentration is located at or near the upper surface 105c. Hence, unless otherwise specified, any reference to the dopant concentration of the barrier layer 105, irrespective whether the layer 105 is considered a single layer or a stack of a plurality of sub-layers as is described later on, is meant to relate to the dopant concentration prevailing at the uppermost surface of the barrier layer 105. It should be appreciated that any positional references such as upper, lower, above, below and the like are to be taken relative to the substrate 101.

In one embodiment, the dopant material, such as the aluminum, may be significantly restricted in depth to approximately 0-15 Å with respect to the surface 105a. In other embodiments, the barrier layer 105 may be substantially devoid of any dopant material, which may then be provided in an additional layer, which may nevertheless be considered as a sub-layer of the barrier layer 105, as will be described with reference to FIG. 1b.

A typical process flow for forming the semiconductor device 100 as shown in FIG. 1a may comprise the following processes. After completing any circuit elements located in the substrate 101, the surface of the substrate 101 may be planarized, for instance by providing a dielectric layer (not shown) and performing a chemical mechanical polishing (CMP) process. Thereafter, the first etch stop layer 103 may be deposited by, for instance, well-established plasma enhanced chemical vapor deposition (PECVD) processes. Next, the dielectric layer 102 is formed by any appropriate technique, depending on the material composition and structure required for the layer 102. For instance, silicon dioxide and certain low-k materials on the basis of silicon, carbon, and oxygen, such as SiCOH, may be deposited by well-established PECVD techniques. Other low-k materials may require advanced spin-on techniques to form the layer 102 having the required thickness. Thereafter, the trench 104 may be formed by means of advanced and well-established photolithography and anisotropic etch techniques, wherein, depending on the process strategy, corresponding vias (not shown) may be formed prior to or after the formation of the trench 104. Next, the barrier layer 105 is formed, wherein, in embodiments requiring the incorporation of a dopant material within at least the surface portion 105c of the barrier layer 105, the deposition techniques used are correspondingly modified so as to allow the incorporation of a desired dopant material. In one embodiment, the barrier layer 105 may be substantially comprised of tantalum including a dopant material at least at the surface 105a, such as aluminum in the above-identified amount. The barrier layer 105 may then be formed by established sputter deposition techniques, wherein, in one embodiment, the sputter tool may be modified so as to include an aluminum target or a combined tantalum and aluminum target in order to enable the simultaneous deposition of tantalum and aluminum or to enable a subsequent deposition of tantalum and aluminum. Thereby, correspondingly preparing and/or activating the respective targets may control the amount of dopant material and the location thereof within the barrier layer 105. For example, when the dopant material is to be substantially restricted to the surface 105a, the aluminum target may be activated at a final phase of the deposition process. In other embodiments, the substrate 101 may be moved from one process chamber into another process chamber to incorporate the dopant material in a desired amount within the barrier layer 105.

In other embodiments, the barrier layer 105 may be formed by chemical vapor deposition, wherein the deposition atmosphere may be accordingly modified to incorporate a desired dopant material. For instance, chemical vapor deposition processes for titanium, titanium nitride, aluminum and the like are well established in the art and may be readily applied in the present invention to form the barrier layer 105 including a desired amount of dopant material.

In other embodiments, requiring the reliable deposition of the barrier material within the trench 104 having extremely scaled dimensions and a high aspect ratio, the so-called atomic layer deposition (ALD) technique may be considered appropriate for forming the barrier layer 105. The atomic layer deposition technique is a self-limiting process in which monolayer by monolayer is deposited in a highly conformal and controlled fashion. For instance, corresponding techniques are well established for tantalum and tantalum nitride, so that extremely thin barrier layers may be formed having excellent step coverage. A dopant material, such as aluminum, may then be incorporated into the barrier layer 105 by correspondingly modifying the atomic layer deposition, or by subsequently exposing the barrier layer 105 to a corresponding deposition atmosphere to deposit or incorporate the dopant material on or in the barrier layer 105. In this respect, it is not critical that the dopant material reliably covers all of the internal surfaces of the trench 104 as long as sufficient dopant material is present for a subsequent diffusion process.

It should be appreciated that a combination of two or more of the above described deposition techniques may be used, if a highly complex barrier layer configuration is required. Further, the dopant material may also be introduced into the barrier layer 105 by ion implantation or by means of a plasma atmosphere containing the dopant material or a precursor thereof.

Figure 1B:
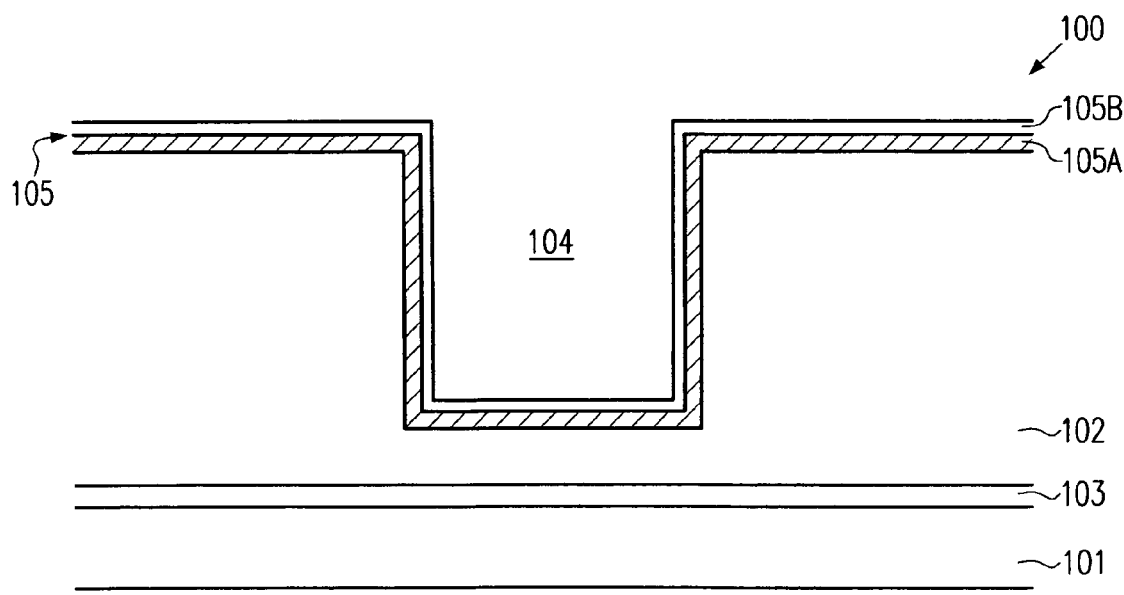

FIG. 1b schematically shows the semiconductor device 100 in accordance with a further alternative. In this embodiment, the barrier layer 105 is comprised of two or more sub-layers, for example, shown as the sub-layers 105a and 105b, which may have a different material composition to enhance the performance of the barrier layer 105. For example, the sub-layer 105a may be comprised of a material that effectively suppresses a diffusion of copper and the diffusion of a dopant material, such as aluminum, into the dielectric layer 102, wherein the dopant material may be present in higher amounts within the sub-layer 105b. For instance, the sub-layer 105a may be comprised of tantalum nitride, while the sub-layer 105b may be comprised of a tantalum/aluminum alloy or any other appropriate barrier material/dopant material alloy. In other embodiments, the sub-layer 105a may represent a plurality of layers providing the required diffusion blocking effect, while the sub-layer 105b may represent one or more layers acting as a dopant supply layer for the diffusion process to be performed later.

In one embodiment, the sub-layer 105b may comprise the dopant material in the form of a catalytic material, or may additionally comprise catalytic material, which is able to initiate an electrochemical deposition of copper in a subsequent copper seed layer formation process. For instance, the sub-layer 105b may comprise cobalt, which may serve as an alloy forming element and as a catalytic material, and/or the sub-layer 105b may additionally comprise platinum, palladium and the like, which effectively accelerate a copper deposition in an electroless plating process.

The sub-layers 105a and 105b may be formed by any of the deposition techniques described above with reference to FIG. 1a, wherein a common deposition process, i.e., a deposition process without breaking the vacuum during the process, may be used, or wherein a sequence of subsequent deposition steps, possibly applying different deposition techniques, may be performed. As previously noted with reference to FIG. 1a, the requirements in view of the step coverage of the sub-layer 105b may be less critical compared to those for the sub-layer 105a, since the sub-layer 105b merely acts as a donating and optionally as a catalytic material layer for subsequent processes.

In the further specification, it may be referred to as the barrier layer 105, while it has to be borne in mind that a single layer or stack of layers may be meant, wherein not necessarily all layers have to be efficient copper blocking materials.

Figure 1C:
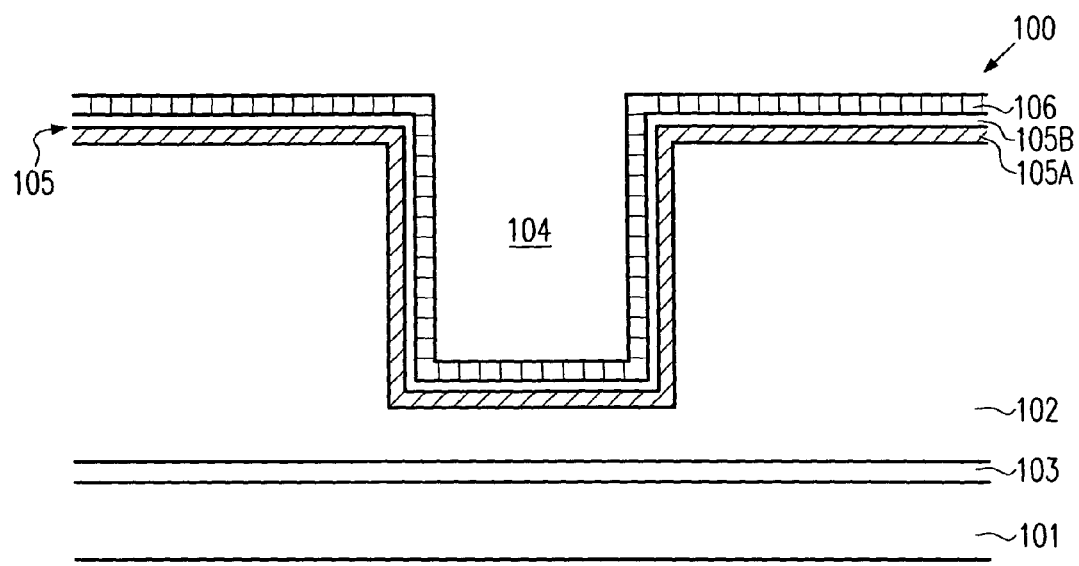

FIG. 1c schematically shows the semiconductor device 100 with a copper seed layer 106 formed thereon. As previously noted, copper may not be deposited in an efficient manner by physical and chemical vapor deposition techniques, and hence, in one illustrative embodiment, the main portion of the copper is deposited by electrochemical plating techniques, wherein electroplating is presently the preferred technique since it currently enables a reliably, substantially void-free filling in of copper from bottom to top, even for high aspect ratio trenches and vias. The electroplating typically, but not necessarily, requires, however, a seed layer to initiate an effective initial material deposition in addition to an effective current distribution across the substrate 101. Consequently, the copper seed layer 106 is deposited, frequently by sputter deposition, with a thickness of several tenths of angstrom to several hundred angstrom.

As previously discussed, in some embodiments of the present invention, it may be advantageous in view of conformality, efficiency and crystallinity of the seed layer 106 to use an electroless plating technique, wherein the initial material deposition is initiated by a catalytic material incorporated into the barrier layer 105 or provided in the form of a separate layer, such as the sub-layer 105b. Hence, the catalytic material may be provided additionally to the alloying dopant material or the alloying dopant material may be selected to simultaneously act as a catalytic material. Suitable candidates for such catalytic/alloying materials may be cobalt, platinum and palladium.

Figure 1D:
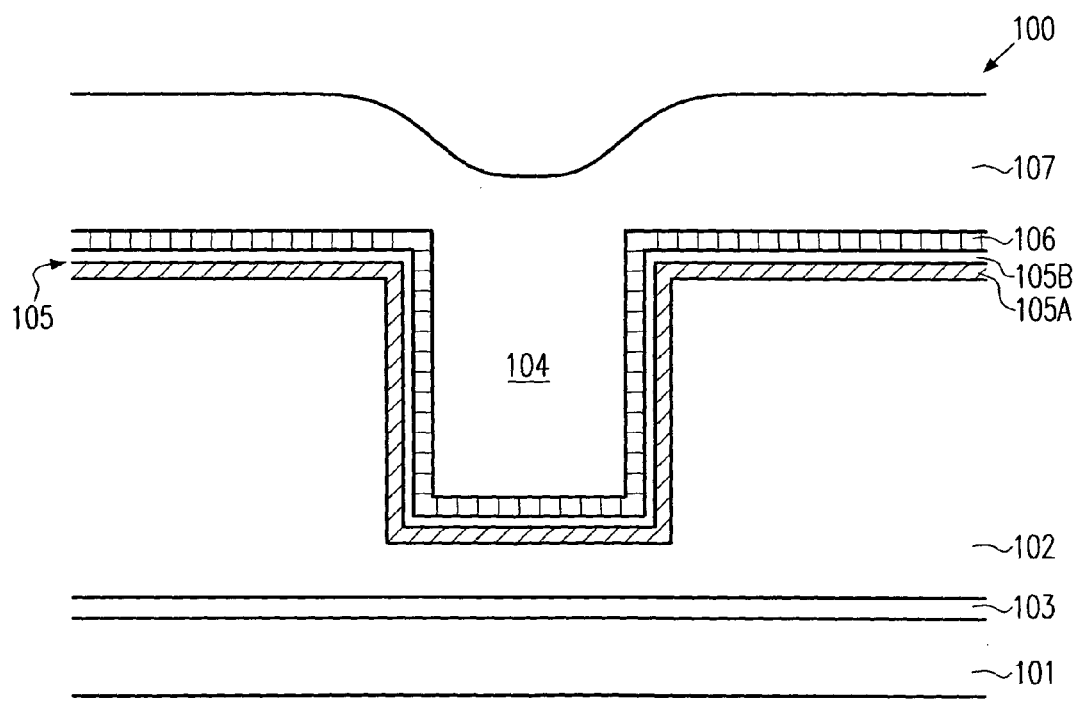

FIG. 1d schematically shows the semiconductor device 100 with a copper layer 107 formed above the substrate 101. The copper layer 107 may be formed by electroplating or by electroless plating, wherein electroplating seems to be preferable at present due to the possibility of manipulating a plurality of process parameters, such as the signal form of the applied current, the arrangement of anodes, and the like, which enable efficient shaping of the deposition process on a local and global scale. That is, by appropriately selecting the signal form of the drive currents and by means of appropriately selected additives, the layer 107 may be deposited from bottom to top within the trench 104 with a certain microstructure while, for instance, the selection of the anode configuration in the electroplating reactor enables the control of the deposition uniformity or non-uniformity across the entire substrate 101. After the deposition of the copper layer 107, in some embodiments, the substrate 101 may be subjected to a heat treatment to manipulate the microstructure, that is, the size and morphology of grains within the layer 107. To this end, the substrate 101 may be exposed to an elevated temperature in the range of approximately 100-250° C. for a time interval from several minutes to several hours, wherein the temperature is advantageously selected high enough to initiate a desired reconfiguration of the microstructure, but still too low to drive a significant amount of dopant material from the layer 105 into the copper of the layers 106 and 107. It should be noted that, in FIG. 1d, the layers 106 and 107 are shown as distinct layers, whereas, in real devices, these layers may merge, especially during the heat treatment, so that these layers may no longer be distinguishable.

In other embodiments, the semiconductor device 100 may not be heat treated at this phase of the manufacturing process and may be directly subjected to a process for removing excess material of the layer 107, the layer 106, and the layer 105 outside of the trench 104, e.g., a chemical mechanical polishing process.

Figure 1E:
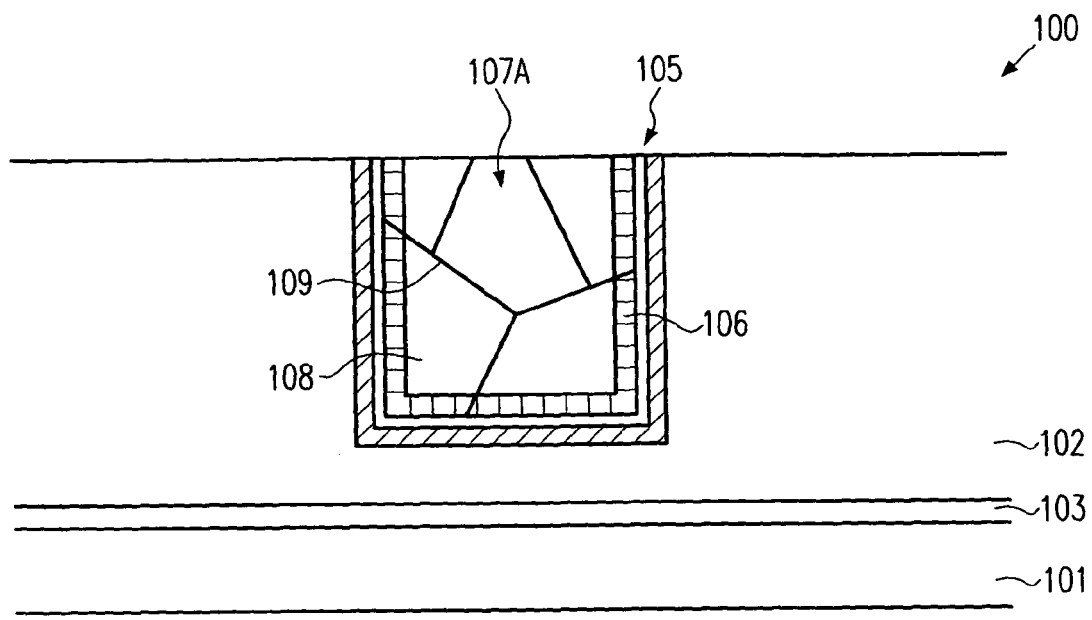

FIG. 1e schematically shows the semiconductor device 100 after the removal of excess material to provide a substantially planar surface and a metal line 107a comprised of the residual copper of the layer 107 and the barrier layers 105. The metal line 107a may comprise a plurality of grains 108, which are separated by grain boundary regions 109, which define a region in which the crystal orientation of the metal grains, i.e., the copper grains, changes from one orientation to another.

The device 100 as shown may be formed by electrochemical polishing and chemical mechanical polishing, or only by chemical mechanical polishing, in accordance with well-established process recipes. After removal of the excess material of the layers 107, 106 and 105, the substrate 101 may, in one embodiment, be subjected to a further heat treatment to establish or re-establish the crystalline structure represented by the grains 108 and the grain boundary regions 109. During this heat treatment, any mechanical stress or damage created during the chemical mechanical polishing may be reduced or removed to obtain the desired microstructure. In some embodiments, the temperature during this post-polish heat treatment may be selected higher than in optional preceding heat treatment processes so that, during the reconfiguration of the metal line 107a, a certain amount of dopant material from the barrier layer 105 may also be driven into the copper line 107a. This may be advantageous for material compositions and/or process parameters, in which the previously created microstructure of the copper is not essentially modified by the polish process. In other embodiments, the temperature during this heat treatment may be selected to substantially avoid an out-diffusion of dopant material into the copper line 107a, when a substantial re-configuration of the post-polish microstructure is necessary.

Figure 1F:
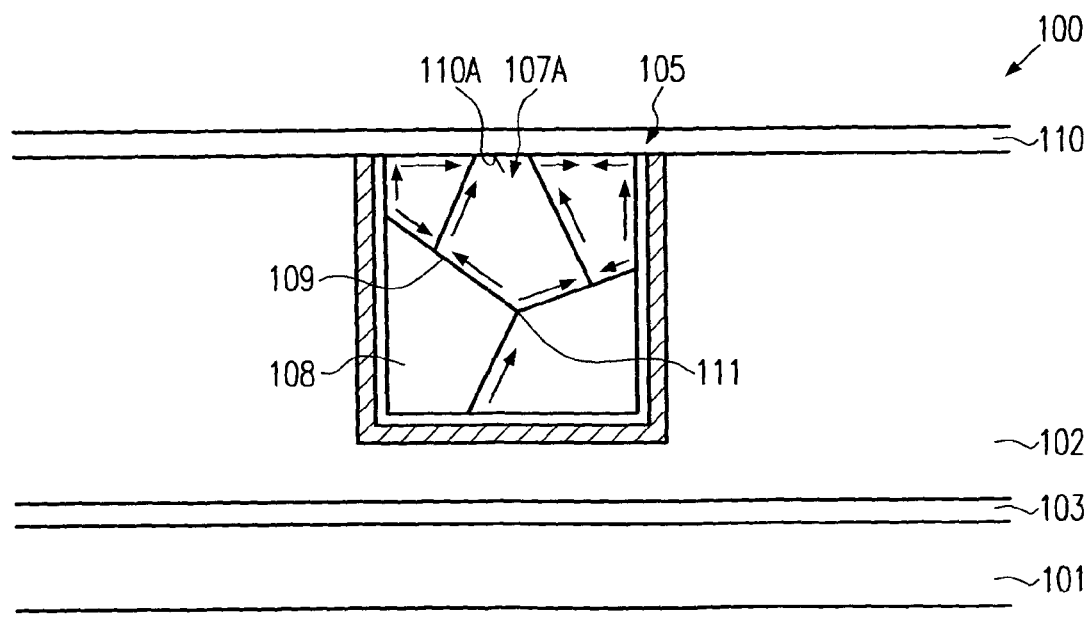

FIG. 1f schematically shows the semiconductor device 100 with a second etch stop layer or capping layer 110 formed on the dielectric layer 102 and on the metal line 107a to form an interface 110a therebetween. The etch stop layer 110 may be comprised of a variety of materials, such as silicon nitride, silicon carbon nitride, and the like, and it may be formed by any appropriate deposition technique, such as well-established plasma enhanced CVD processes. Typically, prior to depositing the etch stop layer 110, which may also be considered as a capping layer for the copper line 107a, the substrate 101 is subjected to a cleaning process to remove any copper oxides and discolorations that may have formed during and after the removal of the excess material.

As discussed, the interface 110a has been identified as a main diffusion path for copper during the operation of the metal line 107a at elevated current densities and elevated temperatures, which are typically encountered during the operation of sophisticated integrated circuits. That is, during operation, a material transport mechanism may be observed along the interface 110a in a direction perpendicular to the drawing plane of FIG. 1f, resulting in the formation of voids upstream, and of hillocks adjacent to the copper line 107a downstream with respect to the current flow direction. This stress-induced material transport may be significantly reduced according to the present invention in that a portion of the dopant material is effectively supplied to the interface 110a by heat treatment at elevated temperatures in the range of approximately 300-400° C. for approximately 60-600 seconds, wherein the diffusion substantially takes place along the grain boundary regions 109, as indicated by the arrows, while the diffusion, and thus the concentration through or within the grains 108, is significantly less.

The process parameters of the heat treatment for driving the dopant material to the interface 110a may be selected in accordance with process requirements. For instance, in some embodiments the duration and/or the process temperature may be selected to achieve substantially the same concentration of the dopant material at the vicinity of the interface 110a, as is also present in the barrier layer 105 and in the grain boundary regions 109, thereby establishing what may be considered as an equilibrium state with respect to the dopant concentration in the donating barrier layer 105, the grain boundary regions 109, and the interface 110a. On the other hand, the finally obtained concentration of dopant material within the grain boundary regions 109 and at the interface 110a is, despite of this "equilibrium state," significantly higher than the concentration within the grains 108 due to the significant difference in diffusivity of the dopant material within the grain boundary regions 109 and the grains 108. In other embodiments, the diffusion process may be discontinued at a stage where the dopant concentration within the donating barrier layer 105 is still higher than at the interface 110a, thereby maintaining a diffusion gradient, which may result in a further dopant diffusion during operation of the device 100. This holds especially true for cases in which the initial dopant concentration in the barrier layer 105 is moderately high, for instance approximately 50 atomic % or more with respect to the total material comprising the barrier layer 105 so that any further heat treatment during further processing of the device 100 or the operation thereof may lead to an alloy formation at the interface 110a.

Electromigration tests performed on the basis of samples including a metal line, such as the metal line 107a, wherein the barrier layer 10S contains a surface portion or sub-layer 105b that is comprised of a tantalum aluminum alloy, and wherein the capping layer 110 is comprised of silicon nitride, indicate a significant non-uniform diffusion, and thus a finally-achieved dopant concentration within the metal line, where the dopant concentration is substantially confined to the barrier layer 105 after deposition of the copper and the silicon nitride capping layer. Then, a high dopant concentration is obtained after a corresponding heat treatment as, for example, schematically depicted in FIG. 1f, within the grain boundary regions 109 and at the interface 110a, thereby significantly increasing the activation energy at the interface 110a that is required to cause a current-induced, mechanical-stress-induced or temperature-induced copper transport along the interface 110a. On the other hand, the dopant concentration within the grains 108 was significantly reduced, indicating that aluminum migration at temperatures as specified above is dominated by the grain boundary diffusion rather than by diffusion within the grains. After operating the test samples at extremely high current densities of several mega-ampere/cm$^2$ at elevated temperatures of up to 200° C., the samples prepared in accordance with the present invention demonstrated a significantly prolonged time interval-to-device failure, at least twice the time compared to control samples that did not contain a dopant material within the barrier layer during manufacturing the samples. A further examination of the samples manufactured in accordance with the present invention after the electromigration test showed a more uniform dopant distribution substantially without a difference in concentration between grain boundary regions and grains. Moreover, it was found that, after excessive operation, a void formation preferably took place at triple points, such as, for instance, shown in FIG. 1f as 111, thereby indicating that the interface 110a, representing the main path for stress-induced material transport in conventional devices, is no longer the weakest part in the metal line.

Corresponding investigations of the distribution of dopants within the metal line 107a may be performed by means of electron microscopy or X-ray microscopy tools, which are readily available in semiconductor facilities or in research laboratories. Moreover, based on these measurement techniques, a plurality of samples may be prepared and examined for different process conditions, i.e., for different conditions in forming the barrier layer 105, the copper seed layer 106, the copper layer 107, for different types of material used for the barrier layer 105 and the dopant material, as well as for different process parameters for driving the dopant material towards the interface 110a. From these measurement results, a desired process condition may be selected which results in a desired crystalline microstructure and dopant concentration at the interface 110a, while nevertheless providing the required performance of the metal line. That is, a process condition may be selected, which provides a desired performance for a given line architecture with respect to specified criteria, such as life time, conductivity, production costs, and the like. It should be noted that the measurements for selecting a specified process condition may not necessarily include electron microscopy or X-ray microscopy once at least one other parameter has been identified, on the basis of these measurement techniques, which sufficiently indicates the characteristics of the metal lines. On the basis of the selected process condition, that is, on the basis of a corresponding set of process parameters and material compositions, one or more product substrates may then be manufactured, thereby obtaining semiconductor devices with copper-containing interconnect structures having an enhanced resistance against electromigration while still maintaining a high degree of compatibility to the standard process flow.

As a result, the present invention provides a technique that enables the formation of improved copper-based interconnect structures, wherein the activation energy for stress-induced material transport at interfaces may be increased in that an appropriate dopant-containing material is formed prior to the deposition of copper, wherein subsequently the dopant material is driven to the weak interface, mainly through grain boundary regions, thereby providing moderately high dopant concentrations and thus alloy formation at the weak interface while maintaining a low overall concentration of the dopant material. Correspondingly manufactured semiconductor devices having the non-uniform dopant concentration within the copper-based interconnect structure exhibit a significantly enhanced lifetime during electromigration tests. Moreover, the alloying dopant material may readily be incorporated into the barrier layer by well-established deposition techniques, thereby providing a robust and cost-effective manufacturing process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a conductive barrier layer over an exposed surface of a dielectric layer formed on a substrate, said barrier layer including a dopant material;
    forming a copper-containing layer above said barrier layer;
    forming a dielectric capping layer above said copper-containing layer;
    performing a first heat treatment after the forming of the copper-containing layer to adjust a crystallinity thereof; and
    performing a second heat treatment on said substrate after said first heat treatment to drive a portion of said dopant material towards said capping layer.

2. The method of claim 1, wherein forming said copper-containing layer comprises:
    forming a seed layer above said barrier layer; and
    depositing a copper-containing metal on said seed layer.

3. The method of claim 1, further comprising removing excess material of said copper-containing layer at least one of prior to and after said first heat treatment.

4. The method of claim 1, wherein said dopant material comprises at least one species that in combination with copper reduces stress-induced material transport in said copper-containing layer.

5. The method of claim 4, wherein said dopant species comprises at least one of aluminum, tin and cobalt.

6. The method of claim 1, wherein forming said barrier layer comprises depositing a barrier material and said dopant material by one of physical vapor deposition, chemical vapor deposition and atomic layer deposition.

7. The method of claim 6, wherein said dopant material and said barrier material are deposited in a common deposition process.

8. The method of claim 1, wherein forming said barrier layer comprises forming at least one first layer comprised of barrier material and forming a second layer comprising said dopant material.

9. The method of claim 1, wherein forming said barrier layer comprises forming at least one layer comprised of barrier material and introducing said dopant material into said at least one layer of barrier material.

10. The method of claim 1, wherein said barrier material comprises tantalum.

11. The method of claim 1, further comprising:
    forming a plurality of copper-containing layers with different process conditions;
    determining a value quantifying at least one characteristic of said copper-containing layer; and
    establishing a correlation between said different process conditions used in forming said plurality of copper-containing layers and said at least one characteristic.

12. The method of claim 11, further comprising selecting one process condition on the basis of said correlation and a desired value of said at least one characteristic, and processing one or more product substrates using said selected process condition.

13. The method of claim 11, wherein said at least one characteristic includes at least one of a concentration of dopant material at a weak interface, a lifetime during an electromigration test and a conductivity of the copper-containing layer.

14. The method of claim 1, wherein forming said copper-containing layer comprises forming a catalytic layer in said barrier layer, said catalytic layer comprising at least a portion of said dopant material, and forming a seed layer by electroless wet chemical deposition using said catalytic layer for initiating the seed layer deposition.

15. A method of forming a copper-containing interconnect line, comprising:
    forming a trench in a dielectric layer formed on a substrate;
    forming a dopant layer on exposed surfaces of said trench prior to depositing a copper-containing metal, said dopant layer comprising a dopant material that is able to reduce a stress-induced material transport in a copper-containing interconnect structure;
    forming a metal line in said trench by depositing a copper-containing metal;
    performing a first heat treatment after depositing the copper-containing metal to adjust a crystallinity thereof; and
    performing a second heat treatment of said substrate after performing said first heat treatment to drive a portion of said dopant material into grain boundaries of said copper-containing metal.

16. The method of claim 15, further comprising forming a dielectric capping layer on a top surface of said metal line.

17. The method of claim 16, wherein said capping layer is formed prior to heat treating said substrate.

18. The method of claim 15, wherein a temperature in said first heat treatment is less than a temperature in said second heat treatment.

19. The method of claim 15, wherein at least one process parameter affecting a grain size of said copper-containing metal is controlled on the basis of a desired value for the grain size.

20. The method of claim 15, wherein said dopant layer comprises a barrier material that reduces copper diffusion into the dielectric layer.

21. The method of claim 20, wherein said dopant material and said barrier material are deposited by at least one of physical vapor deposition, chemical vapor deposition, atomic layer deposition and wet chemical deposition.

22. The method of claim 21, wherein said dopant material and said barrier material are deposited in a common deposition process.

23. The method of claim 20, wherein said barrier material comprises at least one of tantalum, nitrogen, titanium, cobalt, tungsten, silicon and combinations thereof.

24. The method of claim 20, wherein said dopant material comprises at least one of aluminum, magnesium, tin and cobalt.

25. The method of claim 15, further comprising forming a conductive barrier layer prior to forming said dopant layer.

26. The method of claim 15, wherein forming said metal line comprises:

forming a copper-containing seed layer in said trench;

depositing the majority of said copper-containing metal by an electrochemical deposition process; and removing excess metal to form said metal line.

27. The method of claim 26, wherein said dopant layer comprises a catalytic material and wherein said seed layer is formed by an electroless plating process.

* * * * *